(12) United States Patent
Jeon

(10) Patent No.: US 10,854,718 B2
(45) Date of Patent: Dec. 1, 2020

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventor: Woochul Jeon, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 111 days.

(21) Appl. No.: 15/438,675

(22) Filed: Feb. 21, 2017

(65) Prior Publication Data

US 2018/0240791 A1    Aug. 23, 2018

(51) Int. Cl.
| | | |
|---|---|---|
| *H01L 29/861* | (2006.01) | |
| *H01L 29/20* | (2006.01) | |
| *H01L 27/07* | (2006.01) | |
| *H01L 27/02* | (2006.01) | |
| *H01L 29/205* | (2006.01) | |
| *H01L 21/8252* | (2006.01) | |
| *H01L 27/06* | (2006.01) | |

(52) U.S. Cl.
CPC ...... *H01L 29/2003* (2013.01); *H01L 21/8252* (2013.01); *H01L 27/0255* (2013.01); *H01L 27/0605* (2013.01); *H01L 27/0629* (2013.01); *H01L 27/0727* (2013.01); *H01L 29/205* (2013.01); *H01L 29/8613* (2013.01)

(58) Field of Classification Search
CPC ............. H01L 27/0255; H01L 27/0272; H01L 29/66136; H01L 29/66204; H01L 29/66219; H01L 29/8613; H01L 27/0727; H01L 27/0629; H01L 27/0605; H01L 29/66227; H01L 29/66462; H01L 29/861; H01L 29/2003; H01L 29/205; H01L 21/8252
See application file for complete search history.

(56) References Cited

U.S. PATENT DOCUMENTS

| | | | | |
|---|---|---|---|---|
| 4,491,746 | A * | 1/1985 | Koike | H01L 27/0222 257/299 |
| 8,772,834 | B2 | 7/2014 | Jeon et al. | |
| 9,356,017 | B1 * | 5/2016 | Siemieniec | H01L 27/0629 |
| 2002/0066908 | A1 | 6/2002 | Smith | |
| 2005/0110042 | A1 | 5/2005 | Saito et al. | |
| 2006/0138454 | A1 | 6/2006 | Saito et al. | |
| 2013/0009165 | A1 * | 1/2013 | Park | H01L 21/8252 257/76 |
| 2013/0082276 | A1 | 4/2013 | Park et al. | |
| 2013/0083567 | A1 * | 4/2013 | Imada | H01L 23/4824 363/37 |

(Continued)

OTHER PUBLICATIONS

Don Disney et al., "Vertical Power Diodes in Bulk GaN," Proceedings of the 25th International Symposium on Power Semiconductor Devices & ICs, Kanazawa, 2013, pp. 59-62.

*Primary Examiner* — Kenneth Parker
*Assistant Examiner* — John Lin
(74) *Attorney, Agent, or Firm* — Robert F. Hightower

(57) ABSTRACT

In one embodiment, a method of forming a HEM diode may comprise forming the HEM diode with high forward voltage that is greater than one of a gate-to-source threshold voltage of a HEMT or a forward voltage of a P-N diode.

20 Claims, 8 Drawing Sheets

(56) References Cited

U.S. PATENT DOCUMENTS

| | | | |
|---|---|---|---|
| 2013/0126942 A1* | 5/2013 | Nakajima | H01L 29/42316 257/192 |
| 2014/0021514 A1* | 1/2014 | Jeon | H01L 27/0629 257/195 |
| 2014/0103969 A1 | 4/2014 | Jeon et al. | |
| 2014/0138704 A1 | 5/2014 | Tanaka et al. | |
| 2014/0231874 A1* | 8/2014 | Hoshi | H01L 29/66462 257/194 |
| 2014/0306235 A1* | 10/2014 | Decoutere | H01L 27/0605 257/76 |

* cited by examiner

US 10,854,718 B2

METHOD OF FORMING A SEMICONDUCTOR DEVICE

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form high electron mobility (HEM) semiconductor devices. Some embodiments of such devices utilized layers of materials selected from group III or group V of the periodic table of elements and in some applications compound semiconductor materials were used. The selected materials sometimes were arranged to form a heterojunction between two of the semiconductor materials. For example, the semiconductor materials could use layers of gallium nitride (GaN) or aluminum gallium nitride (AlGaN). In some applications, the HEM device may have been a transistor often referred to as a HEM transistor (HEMT). Often, it was desirable to have a protection diode connected to the HEMT to provide protection from overvoltage conditions. However, diodes that were formed from the semiconductor materials from group III or group V often had low forward voltages. In some examples, the forward voltages may have been in the range of three to four volts (3-4V). Thus, such diodes generally were not suitable for use as protection diodes. Therefore, protection diodes often were connected so that the reverse breakdown voltage would provide the protection for the HEMT. In some applications, other types of diodes are externally connected to HEMTs to provide overvoltage protection. These external diodes generally increased system cost.

Accordingly, it is desirable to have a protection diode having a forward voltage that is large enough to provide overvoltage protection, or desirable to have a HEM diode that can provide overvoltage protection, or desirable to have a HEM diode that can provide overvoltage protection on the same semiconductor die as an HEMT.

Figure 1:
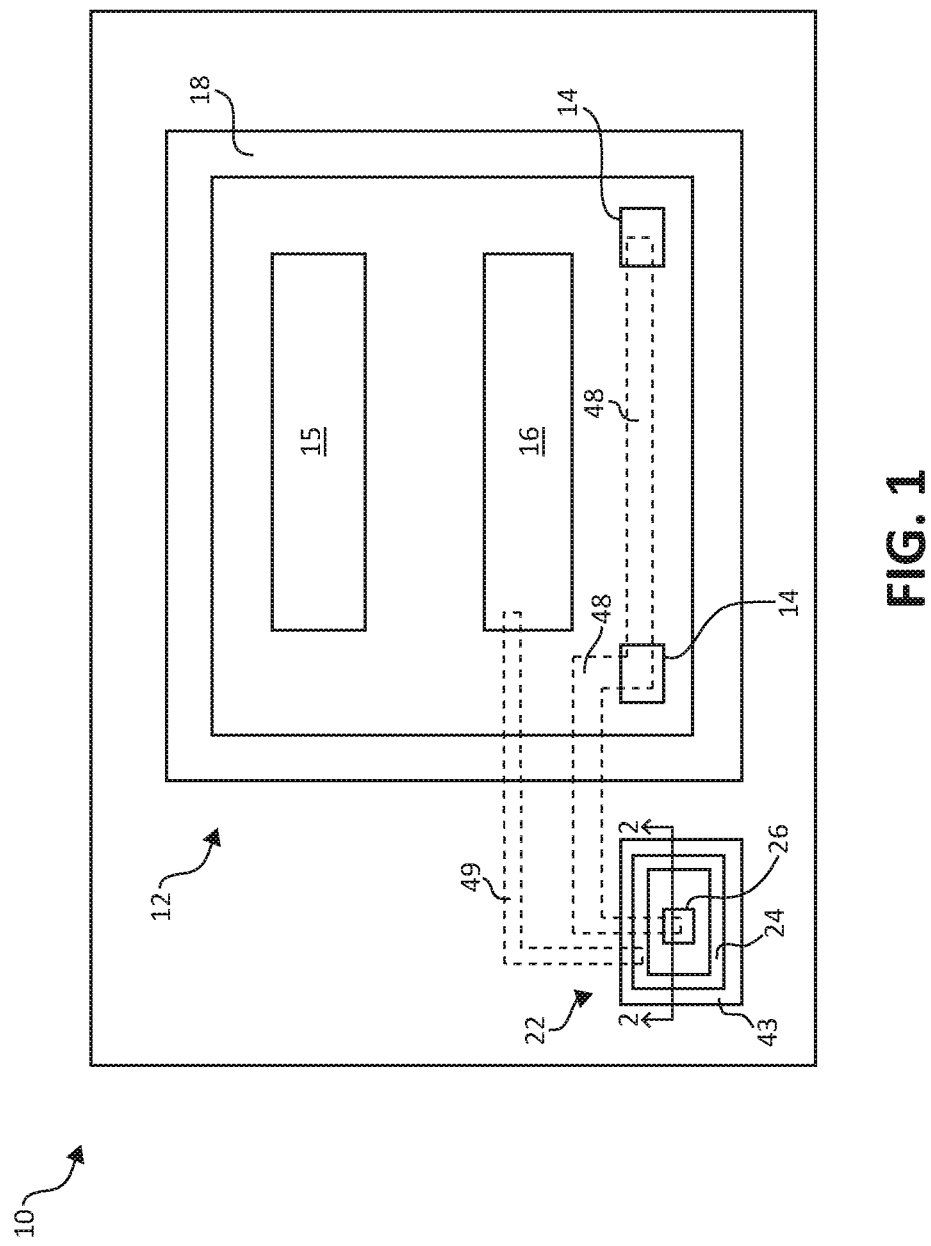
FIG. 1 illustrates, in a general manner, a plan view of a portion of an example of an embodiment of a semiconductor device that may include a high electron mobility transistor (HEMT) and a high electron mobility diode (HEM diode) formed together on a single semiconductor die in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted"

means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description of one or more embodiments may illustrate a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

FIG. 1 illustrates, in a general manner, a plan view of a portion of an example of an embodiment of a semiconductor device 10 that includes an high electron mobility transistor (HEMT) or transistor 12 and a high electron mobility diode (HEM diode) or HEMD or diode 22 that are formed together on a single semiconductor die. Transistor 12 includes a source region that may be connected to a source electrode or source contact pad 15, a drain region that may be connected to a drain electrode or drain contact pad 16, and a gate region that may be connected to one or more gate electrodes or gate contact pads 14. Those skilled in the art will appreciate that the source region, the drain region, and the gate region may be formed as single a stripe across a semiconductor substrate or may be formed as inner digitized fingers or as a plurality of other known structures. In one example embodiment, the active region of transistor 12 is surrounded by an isolation structure 18. In an example embodiment, structure 18 typically extends vertically through the semiconductor material of transistor 12 in order to prevent electron flow from transistor 12 laterally through the semiconductor materials to other elements of device 10 such as for example to diode 22.

As will be seen further hereinafter, diode 22 may be formed to assist in protecting transistor 12 from excessive voltages that may be applied between the gate and source of transistor 12. An embodiment of diode 22 may have an anode connected to the gate of transistor 12 and a cathode that may be connected to the source of transistor 12 so that diode 22 may assist. For example, an anode electrode 26 of diode 22 may be connected to gate electrode 14 of transistor 12 as illustrated by a conductor 48 (illustrated by dashed lines), and a cathode electrode 24 of diode 22 may be connected to source electrode 16 by a conductor 49 (illustrated by dashed lines).

Figure 2:
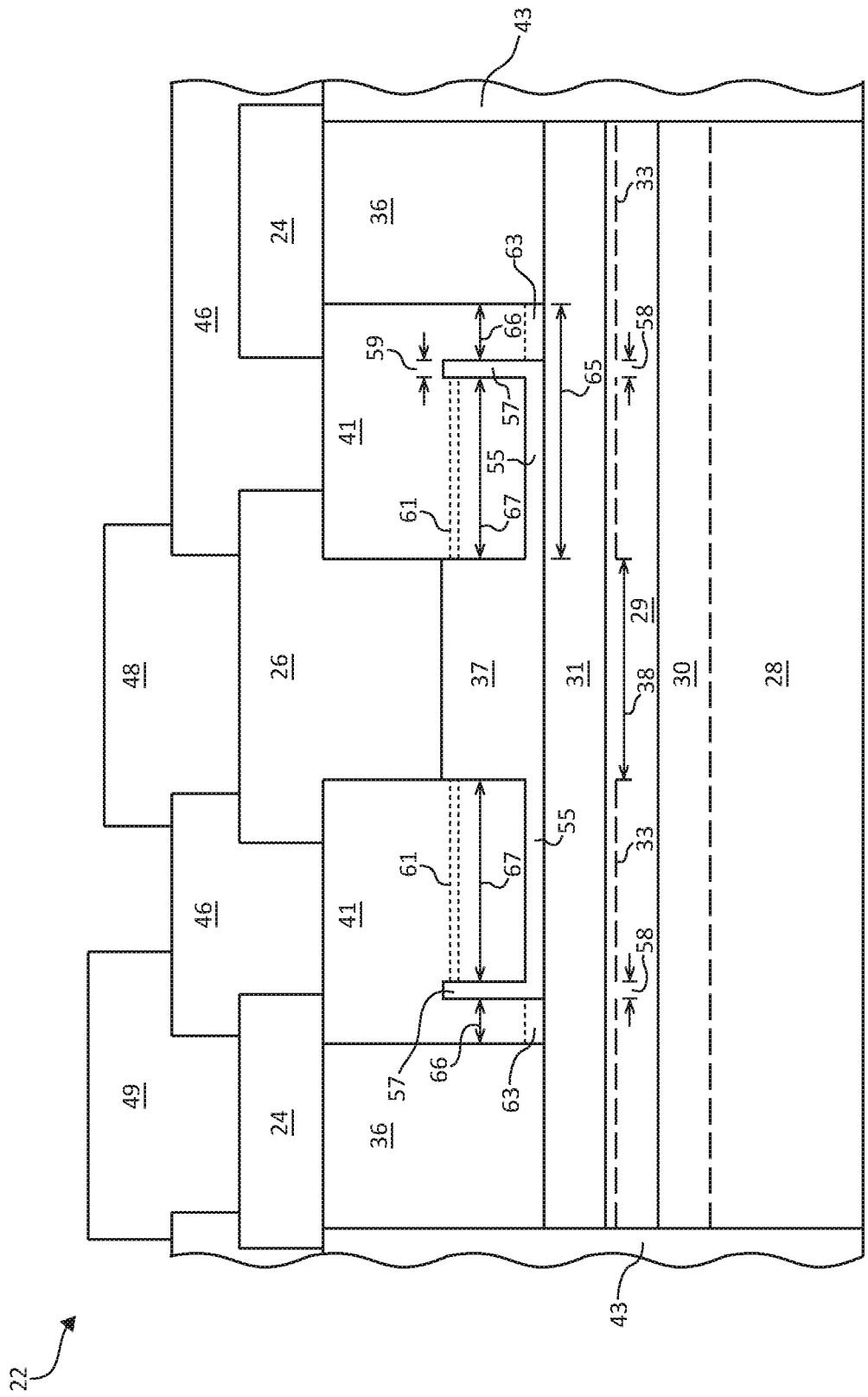
FIG. 2 illustrates a cross-sectional portion of an example of an embodiment of the diode of FIG. 1 in accordance with the present invention.

FIG. 2 illustrates a cross-sectional portion of an example of an embodiment of diode 22 taken along cross-section lines 2-2 of FIG. 1. Diode 22 may be formed on a semiconductor substrate 28. Substrate 28 may be one of a variety of semiconductor materials including silicon carbide (SiC), silicon (Si), sapphire, gallium nitride (GaN), or a variety of compound semiconductors selected from group III or group V. A channel layer 29 of diode 22 may be formed on substrate 28 or alternately may be formed overlying substrate 28. Some embodiments of diode 22 may include an optional buffer layer 30 that may be formed between layer 29 and substrate 28. An electron supply layer 31 may be formed on channel layer 29. The material used for layers 29 and 31 may be selected to form a two-dimensional electron gas (2DEG), illustrated by a dashed line 33, near an interface of layers 29 and 31. Those skilled in the art will appreciate that in some embodiments, the materials may be selected to form a two-dimensional hole gas (2DHG) instead of the 2DEG. Additionally, those skilled in the art will also appreciate that the 2DEG may be formed within layer 31 instead of within layer 29. In one example embodiment, layer 29 may be a layer of gallium nitride (GaN), either doped or undoped. Layer 31 may be a layer of aluminum gallium nitride (AlGaN). Those skilled in the art will appreciate that other combinations of compound semiconductor materials may also be used for layers 29 and 31 to form the 2DEG. For example, layers 29 and 31 may be formed from two different materials that wherein one has a larger energy bandgap or polarization than the other material. Layer 29 may be formed from a nitride material, such as one selected from the group including aluminum, gallium, indium, and boron and may be formed as a single layer or as a multi-layer structure.

An anode of diode 22 includes forming a layer 37 on a portion of layer 31. In an embodiment, layer 37 may be formed as a doped compound semiconductor material that is similar to or alternately substantially the same material as layer 31 except that layer 37 has a doping type such that a P-N junction is formed with the portion of the material of layer 31 onto which layer 37 is disposed. For example, layer 37 may be doped to form layer 37 as a P-type semiconductor material. A cathode region is formed by a cathode conductor 36 that is formed on another portion of layer 31 and spaced a distance 65 from layer 37. Conductor 36 may be formed on or recessed into layer 31 and may form an ohmic connection to layer 31. In some embodiments, conductor 36 may be formed as a multiply-connected domain, for example, formed as a structure that has an opening in the middle such as for example a doughnut shape. Conductor 36 may have an embodiment that encloses layer 37. One example is illustrated in FIG. 1 where cathode electrode 24 overlies conductor 36 and surrounds an outer perimeter of anode electrode 26. An insulator 41 may be in the space between conductor 36 and layer 37. In some embodiments, insulator 41 may have a thickness or height extending substantially perpendicular to layer 31 that is no less than the thickness or height of conductor 36. Cathode electrode 24 may be formed on conductor 36 to facilitate electrically connecting the cathode region to other elements of device 10 (FIG. 1). Anode electrode 26 may be formed on layer 37 to provide an electrical connection to layer 37 and to facilitate electrically connecting the anode region to other elements of device 10. The material of electrode 26 forms an ohmic connection to layer 37. The thickness or height of layer 37 may be less than the height or thickness of conductor 36, thus, a portion of insulator 41 may abut a portion of electrode 26. An insulator 46 may be formed to cover electrode 24 to protect electrode 24 from undesirable electrical connections to other elements of device 10. Those skilled in the art will appreciate that in an embodiment, electrode 24 may extend perpendicular to the plane of the page and be electrically connected to other electrodes or conductors at or near an end of conductor 24. In some embodiments, electrode 24 and conductor 36 may be formed at the same time. In one example embodiment, an active region of diode 22 may be surrounded by an insulator 43 to provide isolation between diode 222 and other elements such as transistor 12.

An embodiment of diode 22 may also include a control element 57 that may assist in increasing a forward voltage (Vf) of diode 22. Element 57 may be formed from a compound semiconductor material that may be doped to inhibit the formation of the 2DEG near the interface of layers 29 and 31 that directly underlies element 57. In one embodiment, element 57 may be formed from the same semiconductor material as layer 37. An embodiment of element 57 may be interconnected to layer 37 by a conductor layer 55. Layer 55 may have an embodiment that is formed from the same semiconductor material as layer 37 but has a thickness that is too small, in light of the P-type doping concentration, to inhibit the formation of the 2DEG in portions of layers 29 and 31 that underlie layer 55, such as for example as illustrated by a gap 58. Layer 55 may have an embodiment that has a thickness that is less than approximately fifty nano-meters and preferably less than approximately twenty nano-meters, or alternately that is no greater than approximately twenty percent (20%) of the thickness of element 57 or in an another embodiment of the thickness of layer 37. In another embodiment, layer 55 may be spaced away from layer 31, such as for example is illustrated by dashed lines 61 so that layer 55 does not substantially interfere with the 2DEG. Alternately, a high resistance connection may be made between layer 37 and elements 57. In some optional embodiments, layer 55 may extend past element 55 to toward or alternately to physically and electrically contact conductor 36, as illustrated by a dashed line 63.

One edge of element 57 may be spaced a distance 67 from layer 37 and another edge of element 57 may be spaced a distance 66 from conductor 36. In another embodiment, the center or any other selected point of element 57 may be spaced distance 67 from layer 37 and distance 66 from conductor 36. Insulator 41 may extend between element 57 and conductor 36. An embodiment may include that the sum of a width 59 and distances 66 and 67 is no greater than distance 65. Distance 67, thus also distance 66, is chosen to provide a desired value of the forward voltage for diode 22. In an embodiment, the thickness or height of element 57 may be substantially the same as the height or thickness of layer 37, but may be other heights in other embodiments. A width 59 of element 57 is the distance element 57 extends laterally between layer 37 and conductor 36. Width 59 is formed to facilitate the depletion of the 2DEG in the underlying portion of layer 29. The width may be selected based on the doping concentration of element 57 and/or the height. In an embodiment, width 59 is formed to extend substantially parallel to the plane of layer 31. Element 57 is formed such that the forward voltage (Vf) changes proportionally to changes of distance 66 and/or 67.

Diode 22 may be driven by a voltage (Vd) that may be applied between the cathode and anode such that the anode is more positive than the cathode. As the drive voltage increases, it eventually reaches an anode voltage value (Va) which is sufficient to form a conduction path under layer 37. However, since element 57 is separated from element 37, the voltage on element 57 is less than the voltage Va on layer 37. For example, in one embodiment layer 55 may separate element 55 from layer 37 and the lateral resistance of layer 55 may cause the voltage on element 57 to be less. Therefore, the anode voltage (Va) is not sufficient to form a conduction path under element 57, thus, current cannot flow from the anode to the cathode of diode 22. As the drive voltage increases to a value greater than anode voltage (Va), the drive voltage eventually reaches the forward voltage (Vf) value that is sufficient to form a path for electron flow under element 57 as well as under layer 37. In an embodiment the conduction path under element 57 allows electrons to flow along the 2DEG that underlies either side of element 57. Thus, the forward voltage (Vf) forms a conduction path from anode electrode 26 through layer 37 and layer 31, laterally through channel layer 29 including under layer 37 and element 57, to cathode conductor 36 and cathode electrode 24.

The value of the forward voltage (Vf) can be changed by changing distances 66 and 67. Moving element 57 closer to cathode conductor 36 and away from layer 37 increases the forward voltage, and moving element 57 closer to layer 37 and away from conductor 36 decreases the forward voltage. Such as for example by, respectively, increasing the resistance in the path between layer 37 and element 57, or by decreasing the resistance in the path between layer 37 and element 57. In an embodiment, the forward voltage may be affected by distance 66, and thus distance 67, as illustrated in the following equation:

$$Vf = (1 + (D67/D66)) * Va$$

where:
Vf = the forward voltage of diode 22 that allows diode 22 to conduct current from the anode to the cathode,
D66 = distance 66,
D67 = distance 67,
Va = the anode voltage (voltage from cathode-to-anode) that forms an electron conduction path under element 37 wherein the electron conduction path extends from one side of element 37 under layer 37, to another side.

Figure 3:
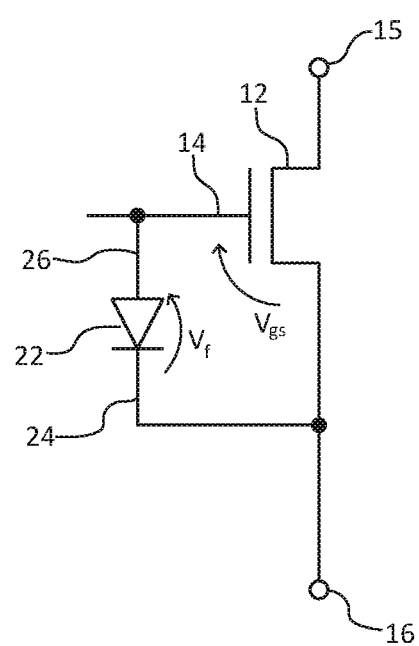
FIG. 3 schematically illustrates an example of an embodiment of a circuit that may be formed by an embodiment of the device of FIG. 1 in accordance with the present invention.

FIG. 3 schematically illustrates an example of an embodiment of a circuit that may be formed by an embodiment of device 10. The anode of device 22 may be connected to the gate of transistor 12 and the cathode of diode 22 may be connected to the source of transistor 12. For example, anode electrode 26 may be electrically connected to gate electrode 14 and cathode electrode 24 may be electrically connected to source electrode 16.

Figure 4:
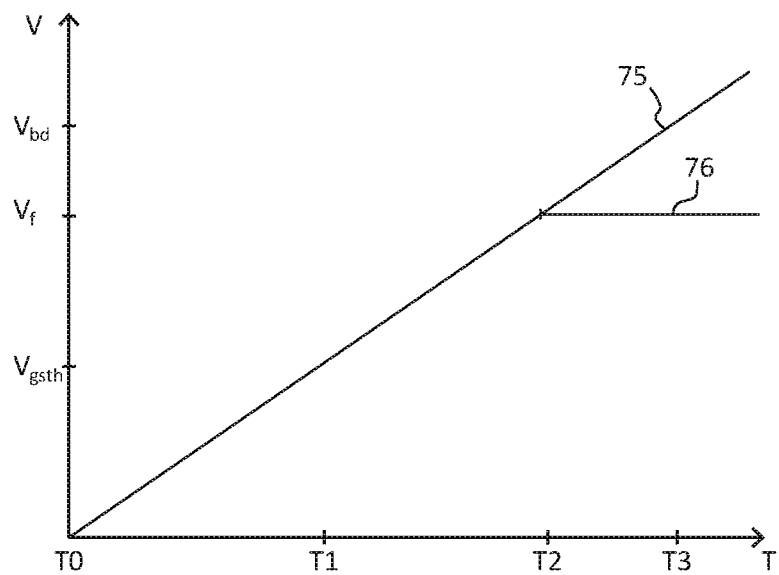
FIG. 4 is a graph having plots that illustrate in a general manner an example of some signals that may be formed during an example of an embodiment of operating the device of FIG. 1 in accordance with the present invention.

FIG. 4 is a graph having plots that illustrate in a general manner an example of some signals that may be formed during an example of an embodiment of operating device 10. A plot 75 illustrates a drive voltage that may be formed by an external source to be applied to the gate of transistor 12 relative to the source, and a plot 76 illustrates the actual gate voltage of transistor 12 relative to the source. The abscissa illustrates time and the ordinate illustrates increasing value of voltage.

Figure 5:
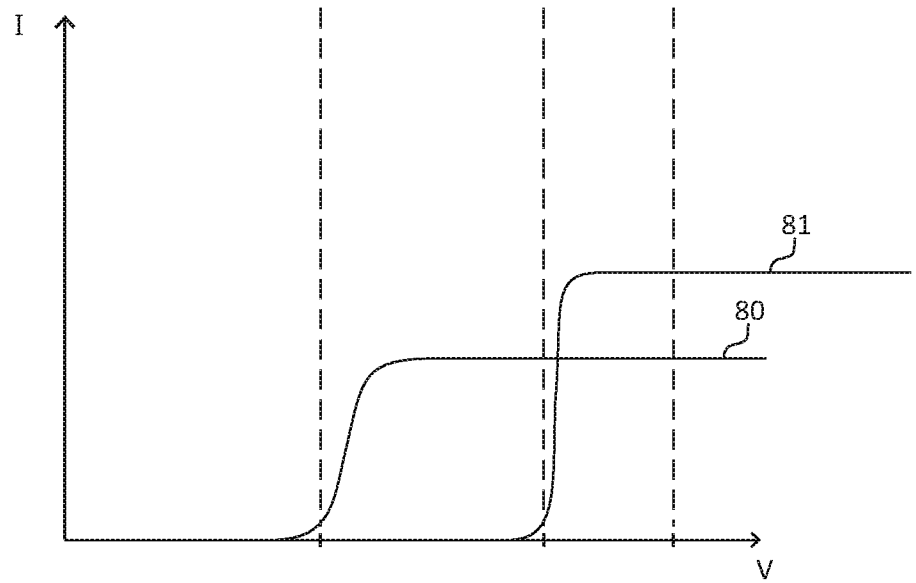
FIG. 5 is a graph having plots that illustrate in a general manner an example of some other signals that may be formed during an example of an embodiment of operating the device of FIG. 1 in accordance with the present invention.

FIG. 5 is a graph having plots that illustrate in a general manner an example of some other signals that may be formed during an example of an embodiment of operating of device 10 for the signals illustrated in FIG. 4. A plot 80 illustrates a drain-to-source current (Ids) that may be conducted by transistor 12 under the operating conditions described for plots 75 and 76, and a plot 81 illustrates a diode current (Id) conducted from the anode to the cathode of diode 22. The abscissa illustrates increasing voltage and the ordinate illustrates increasing current. This description has references to FIGS. 2-5.

In one example embodiment, the forward voltage (Vf) of diode 22 may be formed to be higher than a gate-to-source threshold voltage (Vgsth) of transistor 12, but less than a gate-to-source breakdown voltage (Vbd) of transistor 12. Those skilled in the art will understand that the gate-to-source threshold voltage (Vgsth) of a transistor is the Vgs value at which a transistor begins to conduct current from the drain to the source for a fixed value of source-to-drain voltage. During normal operation when the gate-to-source voltage (Vgs) of transistor 12 is at or slightly greater than the gate-to-source threshold voltage (Vgsth), diode 22 substantially does not affect the operation of transistor 12.

Assume that at a time T0, the drive voltage applied to device 10 begins to drive the gate-to-source voltage (Vgs) of transistor 12 from zero volts toward a larger value. Assume that at a time T1, the value of the drive voltage becomes substantially equal to or greater than the gate-source threshold voltage (Vgsth) and transistor 12 becomes enabled to allow drain current (Ids) to flow from the drain to the source of transistor 12, for example as illustrated by plot 80 near T1. Since in this example embodiment the forward voltage (Vf) of device 22 is greater than the gate-to-source threshold voltage (Vgsth), diode 22 substantially does not conduct current, for example as illustrated by plot 81 near T1, and substantially does not affect the normal operation of transistor 12.

In some cases, a condition may occur that may cause the drive voltage applied to device 10 to increase to a greater value such as is illustrated by plot 75 from time T1 to a time T3. For example, a short or other condition may cause the drive voltage to increase. As Vgs increases past Vgsth, the drain current (Ids) may increase, but may not in other embodiments. In response to the drive voltage increasing to or crossing substantially the forward voltage (Vf) of diode 22, diode 22 turns on in the forward conduction mode and begins to conduct diode current (Id) from the anode to the cathode, such as is illustrated by plot 81 near T2. The diode current (Id) bypasses transistor 12 and substantially does not affect transistor 12. Diode 22 turning on also clamps or limits the gate-to-source voltage (Vgs) to a value no greater than the forward voltage (Vf) of diode 22. Since Vgs is clamped to Vf and remains greater than Vgsth, transistor 12 continues to conduct the drain current (Ids) as is illustrated by plot 80.

As the drive voltage increases past the forward voltage of diode 22, for example as illustrated by plot 75 after T2, diode 22 prevents the Vgs of transistor 12 from increasing past the forward voltage of diode 22, for example as is illustrated by plot 76 at and after T2. Since the forward voltage of diode 22 is less than the gate-source breakdown voltage (Vbd) of transistor 12, the forward voltage of diode 22 substantially prevents Vgs from increasing substantially above the forward voltage (Vf) and assists in substantially protecting transistor 12 from the excessive voltage that would otherwise have been applied to the gate of transistor 12.

As described hereinbefore, element 57 may be positioned such that distance 66 and/or 67 are sufficient to form the forward voltage (Vf) to be greater than the gate-to-source threshold voltage (Vgsth) of transistor 12 and less than the gate-source breakdown voltage (Vbd). For example, distance 66 and/or 67 may be formed so that the forward voltage of diode 22 may be a value halfway between the gate-to-source threshold voltage (Vgsth) and the gate-source breakdown voltage (Vbd), or some other percentage of the values between these two voltages.

Those skilled in the art will appreciate that increasing the forward voltage of a diode is against the design goals of one skilled in the art. Increasing the forward voltage results in increased power dissipation during the operation of the diode, thus, those skilled in the art design to reduce the forward voltage not increase the forward voltage.

In some previous applications, external protection diodes, such as a silicon zener diode for example, sometimes may have been connected between the gate and source of a HEMT in order to protect the HEMT. In other applications, a silicon P-N diode may have been connected to operate in the reverse breakdown mode so that the reverse breakdown voltage of the diode would provide the protection. For example, a silicon P-N diode may have been configured with the anode connected to the source and the cathode connected to the gate. But it was difficult to form these diodes on the same semiconductor chip as a HEMT so these external components increased the system costs.

However, because the configuration of diode 22 facilitates forming diode 22 with a high forward voltage, diode 22 can provide the desired protection. Additionally, forming diode 22 on the same die as a HEMT, reduces the system cost.

In one example embodiment of device 10, distances 66 and 67 were formed to be approximately one and four microns, respectively, resulting in diode 22 having a forward voltage of approximately seven and a half volts (7.5 V). Transistor 12 was formed to have a Vgsth of approximately one and a half volts (1.5 V) and a Vbd of approximately ten volts (10 V). It is expected that forming diode 22 on a die with transistor 12 may decrease the system cost of the system that uses device 10 over applications that use an external diode to protect a HEMT transistor. Additionally, such an integrated diode 22 would have improved performance over an external diode.

Figure 6:
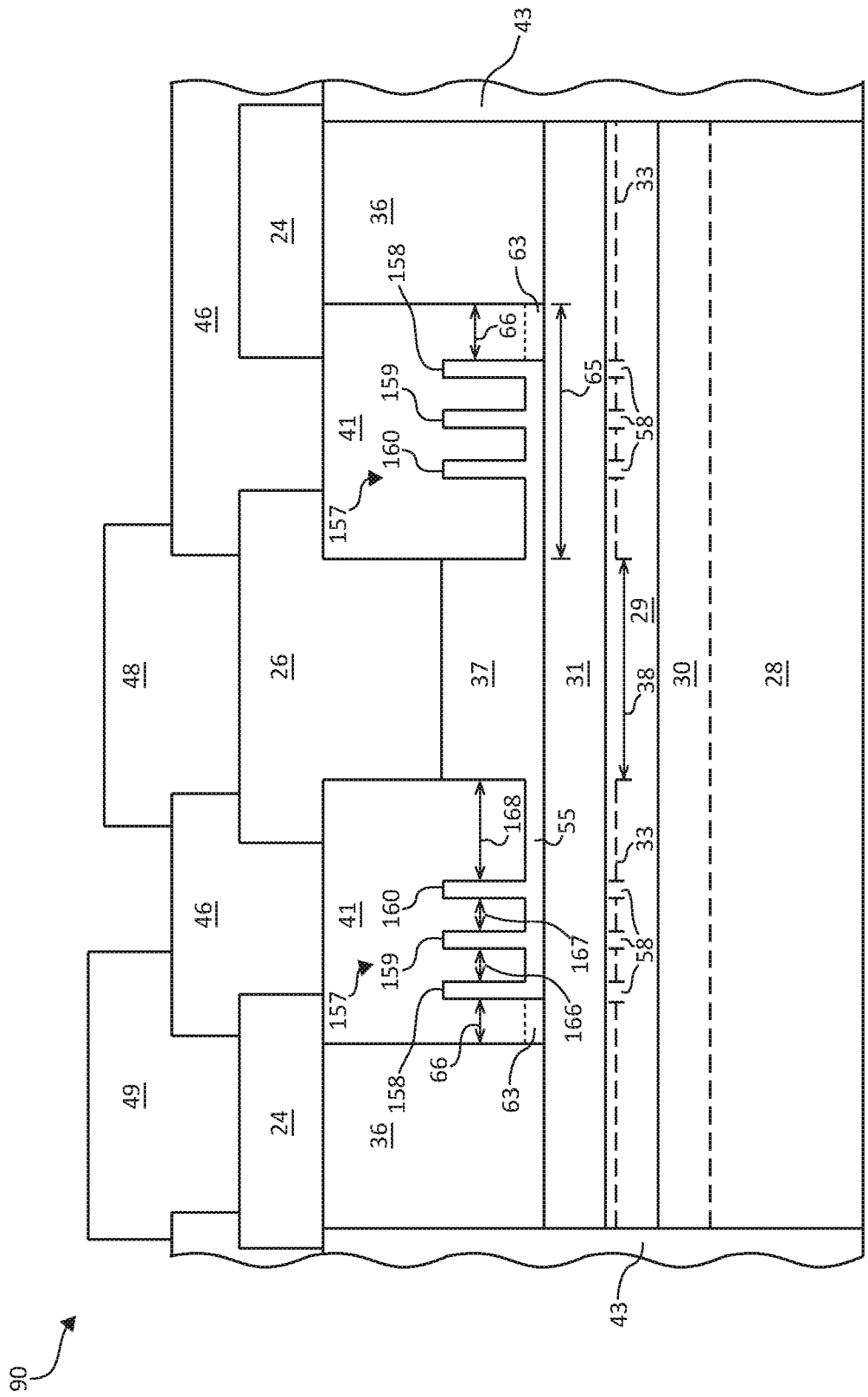
FIG. 6 illustrates a cross-sectional portion of an example of an embodiment of a HEM diode that may be an alternate embodiment of the diode of FIG. 2 in accordance with the present invention.

FIG. 6 illustrates a cross-sectional portion of an example of an embodiment of a HEM diode 90 that may be an alternate embodiment of diode 22. Diode 90 may be substantially the same as diode 22 except that diode 90 includes a control element 157 that has a plurality of control elements 158, 159, and 160 instead of the single control element 57 of diode 22. Element 157 may be formed as a plurality of stripes or fingers that are spaced apart from each other and interconnected by conductor 55. Elements 158-160 may extend substantially parallel to each other across and overlie a major surface of substrate 28. Element 157 is formed distance 66 from element 136. Element 159 is formed a distance 166 from element 158 and a distance 167 from element 160. Element 158 is formed a distance 168 from layer 37. The forward voltage of diode 90 may be expressed by the following equation:

$$Vf=(1+(D67/(D166+D168)))*Va$$

Where;
Vf=the forward voltage of diode 90 that allows diode 90 to conduct current from the anode to the cathode,
D166=distance 166,
D167=distance 167,
Va=the anode voltage (voltage from cathode-to-anode) that forms an electron conduction path under element 37 wherein the electron conduction path extends from one side of element 37 under layer 37, to another side.

Diode 90 is expected to have higher current flow due to hole injection through the control structure.

Figure 7:
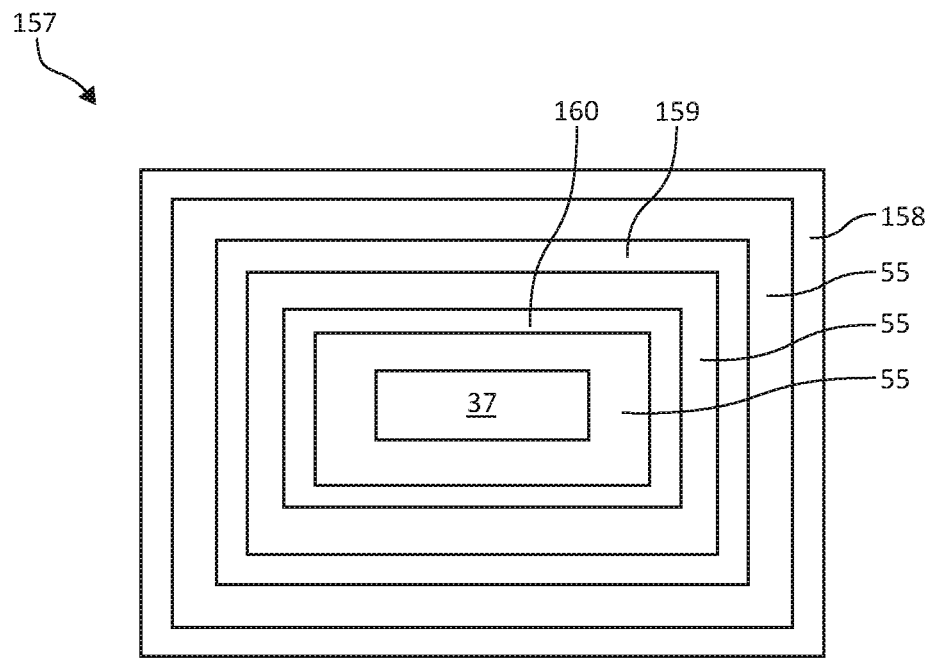
FIG. 7 illustrates a plan view of one example embodiment of an element that may be an alternate embodiment of at least one of the elements of FIGS. 1-2 in accordance with the present invention.

FIG. 7 illustrates a plan view of one example embodiment of element 157 in which elements 158-160 are formed as concentric polygons that enclose or are formed around layer 37. Those skilled in the art will appreciate that element 157 may be formed as concentric circles or other shapes in addition to polygons.

Figure 8:
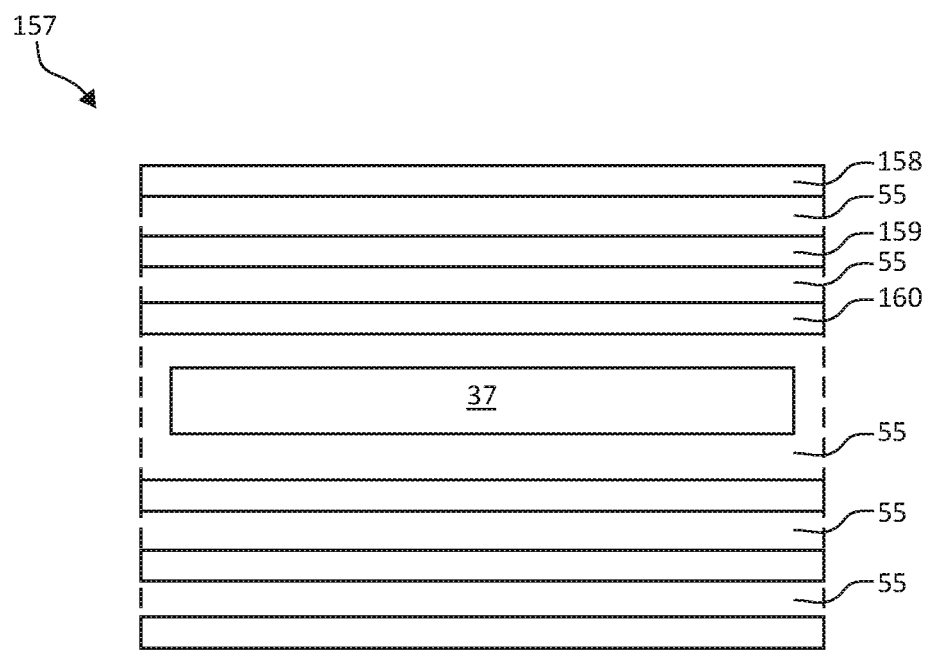
FIG. 8 illustrates a plan view of another example embodiment of an element that may be an alternate embodiment of at least one of the elements of FIGS. 1-2 in accordance with the present invention.

FIG. 8 illustrates a plan view of another example embodiment of element 157 in which elements 158-160 are formed as stripes that are spaced apart and extend substantially parallel to at least a portion of layer 37.

Figure 9:
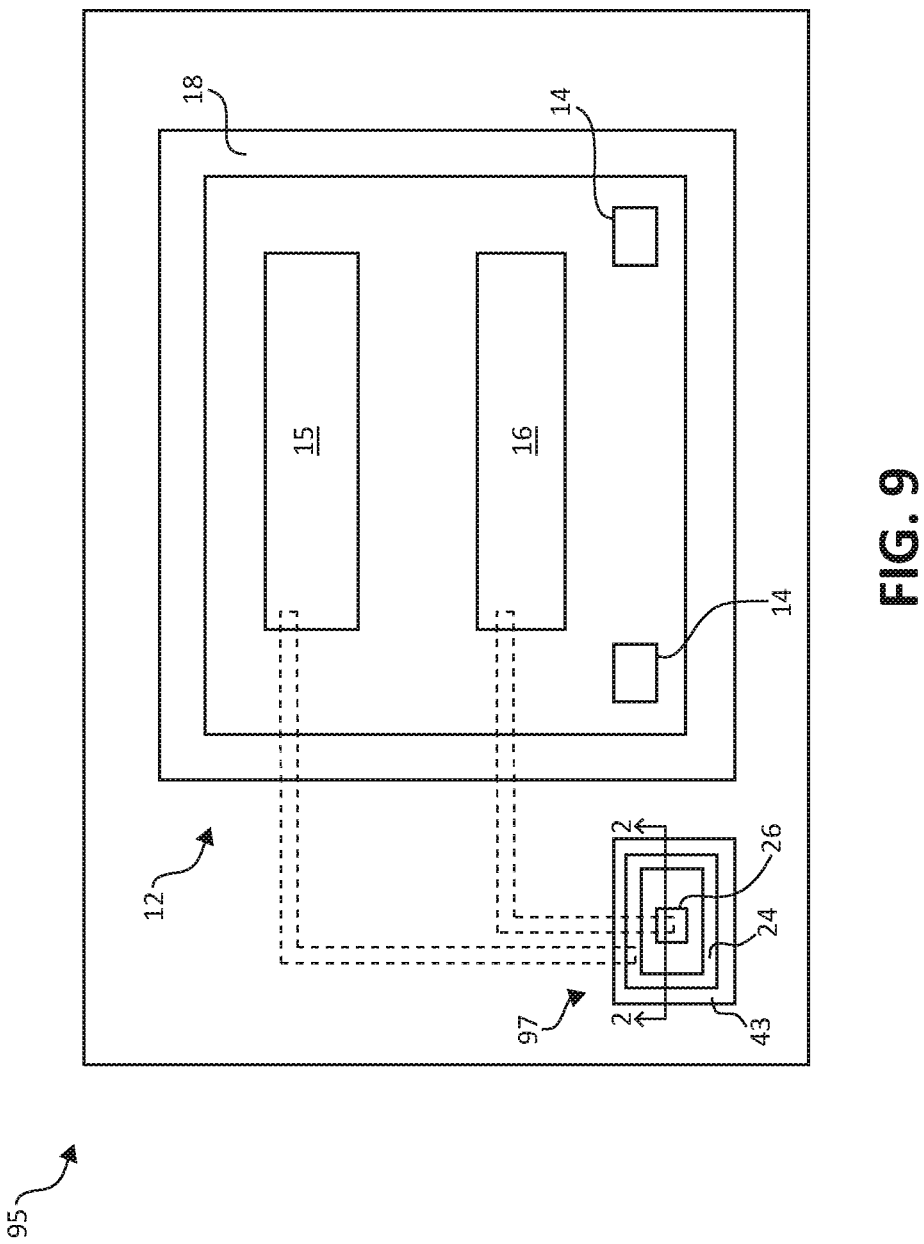
FIG. 9 illustrates a plan view of a portion of an example of an embodiment of a semiconductor device that may be an alternate embodiment of the device of FIG. 1 in accordance with the present invention.

FIG. 9 illustrates a plan view of a portion of an example of an embodiment of a semiconductor device 95 that includes transistor 12 and a high electron mobility diode (HEM diode) or diode 97 that are formed together on a single semiconductor die. Diode 97 is formed substantially the same as either diode 22 or diode 95, but diode 97 is connected to transistor 12 in a different configuration.

Figure 10:
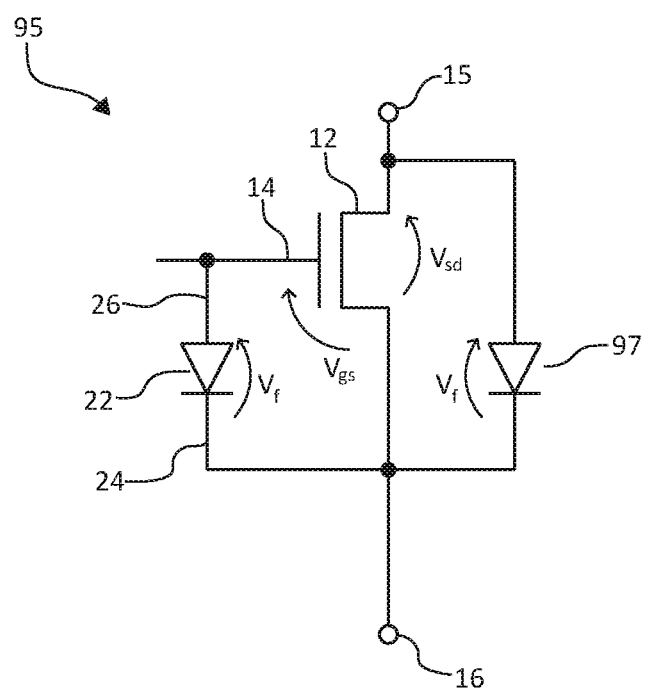
FIG. 10 schematically illustrates an example of an embodiment of some interconnections of a portion of the device of FIG. 9 in accordance with the present invention.

FIG. 10 schematically illustrates an example of an embodiment of the interconnections of a portion of device 95. This description has references to FIG. 9 and FIG. 10. Diode 97 has an anode connected to the drain of transistor 12 and a cathode connected to the source of transistor 12. An embodiment of device 95 may include that diode 97 is formed so that the forward voltage of diode 97 is less than the drain-to-source breakdown voltage of transistor 12 and is also greater than the drain-to-source voltage (Vds) of transistor 12 during the normal operation of transistor 12 such that diode 97 will not affect transistor 12 during normal operation. Diode 97 may have an embodiment wherein the forward voltage is formed to be greater than the maximum specified drain-to-source breakdown voltage of transistor 12 and is also less than a maximum physical breakdown drain-to-source voltage (Vds) that would cause damage to transistor 12 (for example to prevent physical breakdown of the HEMT).

In another embodiment, device 95 may also include either of diode 22 or another diode 97 interconnected substantially the same as in device 10.

In one example embodiment, transistor 12 was formed to have a drain-to-source breakdown voltage that was greater than the forward voltage of diode 97. Consequently, if the voltage applied between the drain and source of transistor 12 becomes greater than the forward voltage of diode 97, diode 97 will clamp the drain-to-source voltage drop across transistor 12 to the forward voltage of diode 97 thereby preventing damage to transistor 12.

From all the foregoing, those skilled in the art will understand that a method of forming a semiconductor device that includes a diode having a high forward voltage may comprise:

providing a semiconductor substrate, such as for example substrate 28;

forming a gallium nitride channel layer, such as for example layer 29, overlying the a first portion of the semiconductor substrate;

forming an aluminum gallium nitride carrier supply layer, such as for example layer 31, on the channel layer wherein a 2DEG region, such as for example region 33, is formed near an interface between the gallium nitride channel layer and the aluminum gallium nitride carrier supply layer;

forming a metal cathode, such as for example cathode 36, on a first portion of the aluminum gallium nitride carrier supply layer;

forming a first P-type GaN layer, such as for example layer 27, on a second portion of the aluminum gallium nitride carrier supply layer wherein the P-type GaN layer is spaced a first distance, such as for example distance 65, from the metal cathode;

forming an insulator, such as for example insulator 41, positioned between the P-type GaN layer and the metal cathode;

forming a metal anode, such as for example anode 26, overlying and electrically connected to the P-type GaN semiconductor layer;

forming a control element as a P-type gallium nitride material, such as for example element 57, on the aluminum gallium nitride carrier supply layer wherein the control element is electrically coupled to the first P-type GaN semiconductor layer including forming the control element semiconductor material a second distance, such as for example distance 67, and a from the P-type GaN layer wherein the second distance is less than the first distance and wherein a width of the control element semiconductor material is less than a width of the first P-type GaN layer.

Another embodiment of the method may include forming an HEM transistor overlying a second portion of the semiconductor substrate including forming a first isolation region, such as for example region 18, surrounding an outside of the HEM transistor to electrically isolate the HEM transistor from electron flow through the semiconductor substrate between the HEM transistor and the diode having the high forward voltage.

In another embodiment, the method may also include connecting the metal anode of the high voltage diode to one of a gate electrode or a drain electrode of the HEM transistor via a direct electrical connection, and connecting a source electrode of the HEM transistor to the metal cathode of the high voltage diode via a direct electrical connection.

An embodiment may include forming the diode having the high forward voltage to have a forward turn-on voltage that is greater than the Vgs turn-on threshold value and less than the Vgs breakdown voltage.

Another embodiment may include forming a second P-type GaN layer, such as for example layer 55, extending from the first P-type GaN layer to the control element semiconductor material wherein the second P-type GaN layer forms the electrical coupling between the first P-type GaN layer and the control element semiconductor material.

An embodiment may include forming the second P-type GaN layer, such as for example layer 55, to extend laterally from the first P-type GaN layer to abut and form an electrical connection to the control element semiconductor material.

Another embodiment may include forming a plurality of control element semiconductor materials on the aluminum gallium nitride carrier supply layer wherein each control element semiconductor material is spaced further from the first P-type GaN layer than an adjacent one of the plurality of control element semiconductor materials.

The method may also have an embodiment that may include forming a second P-type GaN layer (55) extending laterally from the first P-type GaN layer (37) to abut and form an electrical connection to each of the plurality of control element semiconductor materials.

Those skilled in the art will also appreciate that a method of forming a HEM diode may comprise:

forming the HEM diode with a forward voltage that is greater than one of a gate-to-source threshold voltage of a HEMT or a forward voltage of a P-N diode.

Another embodiment of the method may include providing a semiconductor substrate;

forming a first semiconductor layer, such as for example layer 31, from a group III or group V semiconductor material wherein the first semiconductor layer forms a 2DEG with an underlying second semiconductor layer, such as for example layer 29;

forming a cathode electrode, such as for example electrodes 36, on a first portion of the first semiconductor layer, such as for example layer 31;

forming a third semiconductor layer, such as for example layer 37, from another group III or group V semiconductor material as a first semiconductor material, including forming the third semiconductor layer on a second portion of the first semiconductor layer wherein the third semiconductor layer is spaced a first distance, such as for example distance 65, from the cathode electrode;

forming an anode electrode, such as for example electrode 26, of the diode on the third semiconductor layer;

forming a control element, such as for example element 57, as a second semiconductor material positioned laterally between the third semiconductor layer and the cathode electrode and electrically connected to the third semiconductor layer wherein the second semiconductor material forms a P-N junction with the first semiconductor layer.

The method may also have an embodiment that may include forming the cathode electrode directly on the first portion of the first semiconductor layer.

Another embodiment may include forming the diode to be devoid of a P-type material between the cathode electrode and the first portion of the first semiconductor layer.

Another embodiment may include forming a layer of AlGaN.

In an embodiment, the method may include forming a GaN layer, and wherein forming the control element includes forming the second semiconductor material as a GaN material.

An embodiment may include forming a third semiconductor material, such as for example material 55, extending from the third semiconductor layer to abut and electrically connect to the second semiconductor material of the control element.

Another embodiment may include forming the control element directly on the first semiconductor layer wherein the control element increases the forward turn-on voltage of the diode to a value that is greater than a forward voltage of a P-N junction.

Those skilled in the art will also appreciate that a semiconductor device may comprise:

a first compound semiconductor layer, such as for example layer 29;

a second compound semiconductor layer, such as for example layer 31, on the first compound semiconductor layer;

a cathode electrode, such as for example electrode 36, on a first portion of the second compound semiconductor layer;

a third compound semiconductor layer, such as for example layer 37, on a second portion of the second compound semiconductor layer, such as for example layer 31, and spaced a first distance, such as for example distance 65, from the cathode electrode;

an anode electrode, such as for example electrode 26, on the third compound semiconductor layer;

a control element, such as for example element 37, formed as a fourth compound semiconductor layer on a third portion of the second compound semiconductor layer, the control element spaced a second distance, such as for example distance 67, from the cathode electrode wherein the second distance is less than the first distance, the control element electrically coupled to the third compound semiconductor layer.

An embodiment may include that the third compound semiconductor layer and the fourth compound semiconductor layer may be formed from substantially the same type of material.

Another embodiment may include a fifth compound semiconductor layer extending from the third compound semiconductor layer to abut and electrically connect to the fourth compound semiconductor layer wherein the third compound semiconductor layer, the fourth compound semiconductor layer, and the fifth compound semiconductor layer are substantially the same.

Another embodiment may include that the control element may form the forward voltage of the semiconductor device to be greater than the forward voltage of a P-N junction.

In view of all of the above, it is evident that a novel device and method is disclosed. Included, among other features, is forming a HEM diode on the same semiconductor die as a HEMT. The Hem diode is formed to have a high forward voltage. An embodiment may include forming a semiconductor device wherein the HEM diode is connected across the source and gate of the HEMT to limit the maximum voltage between the gate and source. Forming the HEM diode to limit the maximum gate-to-source voltage of the HEMT to the forward voltage of the diode protects the HEMT from excessive gate voltages. Forming the HEM diode on the same semiconductor die with the HEMT reduces the cost of protecting the gate from excessive voltages.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of device 10 is used as a vehicle to explain the operation method of forming the diode with a high forward voltage.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device including a diode having a high forward voltage comprising:
providing a semiconductor substrate;
forming a gallium nitride channel layer overlying a first portion of the semiconductor substrate;
forming an aluminum gallium nitride carrier supply layer on the gallium nitride channel layer wherein a 2DEG region is formed near an interface between the gallium nitride channel layer and the aluminum gallium nitride carrier supply layer;
forming a metal cathode on a first portion of the aluminum gallium nitride carrier supply layer;
forming a first P-type GaN layer on a second portion of the aluminum gallium nitride carrier supply layer wherein the first P-type GaN layer is spaced a first distance from the metal cathode;
forming an insulator positioned between the first P-type GaN layer and the metal cathode;
forming a metal anode overlying and electrically connected to the first P-type GaN layer;
forming a control element as a P-type gallium nitride material on the aluminum gallium nitride carrier supply layer wherein the control element is electrically coupled to the first P-type GaN layer including forming the control element a second distance from the first P-type GaN layer and separated from the metal cathode by a third distance wherein the second distance is less than the first distance and wherein a width of the control element is less than a width of the first P-type GaN layer and wherein the control element inhibits formation of the 2DEG underlying the control element and the first P-type GaN layer inhibits formation of the 2DEG underlying the first P-type GaN layer but the 2DEG is formed underlying the third distance between the first P-type GaN layer and the control element.

2. The method of claim 1 further including forming an HEM transistor overlying a second portion of the semiconductor substrate including forming a first isolation region surrounding an outside of the HEM transistor to electrically isolate the HEM transistor from electron flow through the semiconductor substrate between the HEM transistor and the diode having the high forward voltage.

3. The method of claim 2 further including connecting the metal anode of the high voltage diode to one of a gate electrode or a drain electrode of the HEM transistor via a direct electrical connection, and connecting a source electrode of the HEM transistor to the metal cathode of the high voltage diode via a direct electrical connection.

4. The method of claim 3 wherein forming the HEM transistor includes forming the HEM transistor to have a Vgs turn-on threshold value and a Vgs breakdown voltage; and further including forming the diode as a HEM diode having the high forward voltage to have a forward turn-on voltage that is greater than the Vgs turn-on threshold value and less than the Vgs breakdown voltage.

5. The method of claim 1 further including forming a second P-type GaN layer extending from the first P-type GaN layer to the control element semiconductor material wherein the second P-type GaN layer forms the electrical coupling between the first P-type GaN layer and the control element semiconductor material.

6. The method of claim 5 further including forming the second P-type GaN layer to extend laterally from the first P-type GaN layer to abut and form an electrical connection to the control element semiconductor material.

7. The method of claim 5 including forming the second P-type GaN layer to have a thickness that is less than a thickness of the P-type GaN layer and less than a thickness of control element.

8. The method of claim 1 wherein forming the control element semiconductor material includes forming a plurality of control element semiconductor materials on the aluminum gallium nitride carrier supply layer wherein each control element semiconductor material is spaced further from the first P-type GaN layer than an adjacent one of the plurality of control element semiconductor materials.

9. The method of claim 8 further including forming a second P-type GaN layer extending laterally from the first P-type GaN layer to abut and form an electrical connection to each of the plurality of control element semiconductor materials.

10. The method of claim 1 further including forming an insulator positioned between the first P-type GaN layer and the control element wherein the third distance forms a space between the first P-type GaN layer and the control element, and wherein the insulator is within the space.

11. The method of claim 1 including forming the control element in contact with the aluminum gallium nitride carrier supply layer.

12. A method of forming a semiconductor device comprising:
forming a HEM diode and a HEMT on a substrate including forming the HEM diode to have a forward voltage that is greater than a gate-to-source threshold voltage of the HEMT and less than a gate-to-source breakdown voltage of the HEMT; and
forming a control element of the HEM diode positioned a distance laterally between an anode of the HEM diode and a cathode of the HEM diode, the control element spaced laterally apart from the anode wherein the control element inhibits forming a 2DEG region underlying the control element and the 2DEG region is formed underlying a region adjacent to the control element wherein the region adjacent to the control element is positioned laterally between the anode and the control element.

13. The method of claim 12 wherein forming the HEM diode includes forming the anode of the HEM diode coupled to a gate electrode of the HEMT and forming the cathode of the HEM diode connected to a source of the HEMT.

14. The method of claim 12 wherein forming the HEM diode includes forming the control element not underlying the anode wherein the distance forms a desired value for the forward voltage.

15. A method of forming a semiconductor device comprising:
providing a substrate;
forming a HEM diode and a HEMT on the substrate including forming the HEM diode to have a forward voltage that is either greater than a gate-to-source threshold voltage of the HEMT or less than a gate-to-source breakdown voltage of the HEMT;
forming a first semiconductor layer from a group III or group V semiconductor material wherein the first semiconductor layer forms a 2DEG with an underlying second semiconductor layer;
forming a cathode electrode on a first portion of the first semiconductor layer;
forming a third semiconductor layer from another group III or group V semiconductor material as a first semiconductor material, including forming the third semiconductor layer on a second portion of the first semiconductor layer wherein the third semiconductor layer is spaced a first distance from the cathode electrode;

forming an anode electrode of the diode on the third semiconductor layer;

forming a control element as a second semiconductor material positioned laterally between the third semiconductor layer and the cathode electrode and electrically connected to the third semiconductor layer wherein a space is positioned between the control element and the third semiconductor layer and wherein the second semiconductor material forms a P-N junction with the first semiconductor layer, the third semiconductor layer inhibits formation of the 2DEG underlying the third semiconductor layer, the control element inhibits formation of the 2DEG underlying the control element, and the 2DEG is formed underlying the space.

16. The method of claim 15 including forming the cathode electrode directly on the first portion of the first semiconductor layer.

17. The method of claim 16 including forming the diode to be devoid of a P-type material between the cathode electrode and the first portion of the first semiconductor layer.

18. The method of claim 15 wherein forming the first semiconductor layer includes forming a layer of AlGaN.

19. The method of claim 15 further including forming a third semiconductor material extending from the third semiconductor layer to abut and electrically connect to the second semiconductor material of the control element including forming a thickness of the third semiconductor material to be less than a thickness of the third semiconductor layer.

20. The method of claim 15 wherein forming the control element includes forming the control element directly on the first semiconductor layer.

* * * * *